United States Patent
Ratnakumar et al.

(10) Patent No.: US 8,116,130 B1
(45) Date of Patent: Feb. 14, 2012

(54) INTEGRATED CIRCUITS WITH NONVOLATILE MEMORY ELEMENTS

(75) Inventors: Albert Ratnakumar, San Jose, CA (US); Shuang Xie, Cupertino, CA (US); Cheng-Hsiung Huang, Cupertino, CA (US); Yow-Juang Bill Liu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 192 days.

(21) Appl. No.: 12/551,796

(22) Filed: Sep. 1, 2009

(51) Int. Cl.
*G11C 11/34* (2006.01)

(52) U.S. Cl. ............ 365/177; 365/148; 365/225.7; 365/96

(58) Field of Classification Search ............ 365/177, 365/189.011, 148, 225.7, 96, 158, 185.28; 257/209, 529, 370, 315, 378–379, E21.645
See application file for complete search history.

(56) References Cited

U.S. PATENT DOCUMENTS

| | | |
|---|---|---|
| 6,229,733 B1 | 5/2001 | Male |
| 6,288,949 B1 | 9/2001 | Hidaka et al. |
| 6,768,662 B2 | 7/2004 | Hidaka et al. |
| 6,897,543 B1 | 5/2005 | Huang et al. |
| 7,157,782 B1 | 1/2007 | Shih et al. |
| 7,532,533 B2 * | 5/2009 | Andre et al. ............ 365/225.7 |
| 2007/0097751 A1 | 5/2007 | Popoff et al. |
| 2007/0187775 A1 | 8/2007 | Okhonin et al. |

OTHER PUBLICATIONS

Shih et al., U.S. Appl. No. 11/595,329, filed Nov. 10, 2006.

\* cited by examiner

*Primary Examiner* — David Lam
(74) *Attorney, Agent, or Firm* — Treyz Law Group; G. Victor Treyz; David C. Kellogg

(57) ABSTRACT

Nonvolatile memory element circuitry is provided that is based on metal-oxide-semiconductor transistor structures. A nonvolatile memory element may be based on a metal-oxide-semiconductor transistor structure that has a gate, a drain, a source, and a body. During programming operations, control circuitry floats the body while applying a positive voltage to the drain and a negative voltage to the source. This causes the drain and source, which serve as the collector and emitter in a parasitic bipolar transistor, to break down. The drain-to-source (collector-to-emitter) breakdown causes sufficient current to flow through the source to alter the source electrode and thereby increase the resistance of the source significantly. During sensing operations, control circuitry may apply a voltage across the drain and source while grounding the body to determine whether the memory element has been programmed.

20 Claims, 10 Drawing Sheets

|    | PROGRAMMING       | SENSING |
|----|-------------------|---------|
| V1 | 0.9V              | 0.9V    |
| V2 | 0.9V              | 0V      |
| V3 | 2.5V              | 0.9V    |
| V4 | ≤$V_S$            | 0.9V    |
| V5 | $V_S$= -0.5 TO -1.0V | 0V   |

FIG. 9

INTEGRATED CIRCUITS WITH NONVOLATILE MEMORY ELEMENTS

BACKGROUND

This invention relates to integrated circuits, and more particularly, to nonvolatile memory element circuitry for integrated circuits.

Integrated circuits sometimes contain volatile memory elements. For example, dynamic random-access memory (DRAM) and static random-access memory (SRAM) memory chips include numerous rows and columns of volatile memory cells. Devices such as application-specific integrated circuits, microprocessors, and programmable logic device integrated circuits also may contain volatile memory.

Nonvolatile memory is used for persistent data storage. For example, nonvolatile memory is sometimes used for storing image files in a camera or for storing documents on a universal serial bus memory key.

Nonvolatile memory based on fuses and antifuses also is sometimes used in integrated circuits. Unlike the reusable nonvolatile memory that is typically installed in cameras and other electronic devices, nonvolatile memory based on fuses and antifuses need not be reprogrammable. Rather, one-time use scenarios are acceptable. Examples of situations in which one-time programmable nonvolatile memory elements such as one-time programmable fuses and antifuses may be used include situations in which a unique identification code is loaded onto an integrated circuit or in which repair settings are permanently loaded into an integrated circuit as part of a manufacturing process. Repair settings might, for example, permanently switch redundant circuitry into use in place of defective circuitry, thereby effectuating a permanent repair of the integrated circuit before shipping to an end user.

When forming nonvolatile memory elements for applications such as redundancy schemes and permanent data storage, it is desirable to select a memory element technology that exhibits satisfactory levels of permanency and power consumption. Tradition nonvolatile memory elements are sometimes formed using laser-programmed links or electrically programmed polysilicon fuses. Laser programming of nonvolatile memory elements requires special programming tools that can add undesirable cost and complexity to the manufacturing process. Polysilicon fuses can be satisfactory, but are only available on integrated circuits that contain polysilicon structures. In some modern semiconductor fabrication processes, polysilicon gate layers are being replaced with metal gate layers. Although additional process steps could be included in this type of fabrication process to form polysilicon memory element structures, the inclusion of additional process steps tends to drive up manufacturing costs and makes manufacturing more difficult.

It would therefore be desirable to be able to provide improved nonvolatile memory element circuitry for integrated circuits.

SUMMARY

Nonvolatile memory element circuitry is provided that is based on metal-oxide-semiconductor transistor structures. The nonvolatile memory element circuitry may be included in an integrated circuit such as a programmable integrated circuit. The programmable integrated circuit may use nonvolatile memory elements to store redundancy information or other nonvolatile data. Volatile memory elements such as random-access memory cells may be used to configure programmable logic components such as metal-oxide-semiconductor transistors. When loaded with configuration data, each random-access memory cell may provide a corresponding static control signal that controls an associated programmable logic transistor.

Each nonvolatile memory element may be based on a metal-oxide-semiconductor transistor structure that has a gate, a drain, a source, and a body. Programming and sensing control circuitry may be used to program the nonvolatile memory elements and may be used to sense whether a given nonvolatile memory element has been programmed or is unprogrammed. The control circuitry may include n-channel and p-channel metal-oxide-semiconductor control transistors.

During programming operations, the control circuitry uses the control transistors to float the body of a nonvolatile memory element while applying a positive voltage to the drain and a negative voltage to the source. This causes the drain and source, which serve as the collector and emitter in a parasitic bipolar transistor, to exhibit breakdown. The drain-to-source breakdown (also sometimes referred to as collector-to-emitter breakdown) causes sufficient current to flow through the source to alter the source electrode. For example, the source electrode may develop a void that increases the resistance of the source by four or five orders of magnitude or more. During sensing operations, control circuitry may apply a voltage across the drain and source while grounding the body to measure the source electrode resistance and thereby determine whether the memory element has been programmed.

Because the nonvolatile memory elements are based on transistor-type structures, the elements may be fabricated with small dimensions, facilitating migration to future technologies. As an example, when implemented using future technologies, the size of contacts in the elements and the voltage needed to burn out the contacts may decrease. Because it is also likely that the voltages used in future technologies will be reduced, this reduction in the voltage needed to burn out the contacts in the elements (when implemented using future technologies) may facilitate the migration of the nonvolatile memory elements to future technologies.

Further features of the invention, its nature and various advantages will be more apparent from the accompanying drawings and the following detailed description of the preferred embodiments.

BRIEF DESCRIPTION OF THE DRAWINGS

FIG. 9 is a table of illustrative programming voltages and sensing voltages that may be applied to the terminals of a nonvolatile memory element circuit of the type shown in FIG. 7 using programming and sensing circuitry of the type shown in FIG. 8 in accordance with an embodiment of the present invention.

DETAILED DESCRIPTION

Figure 1:
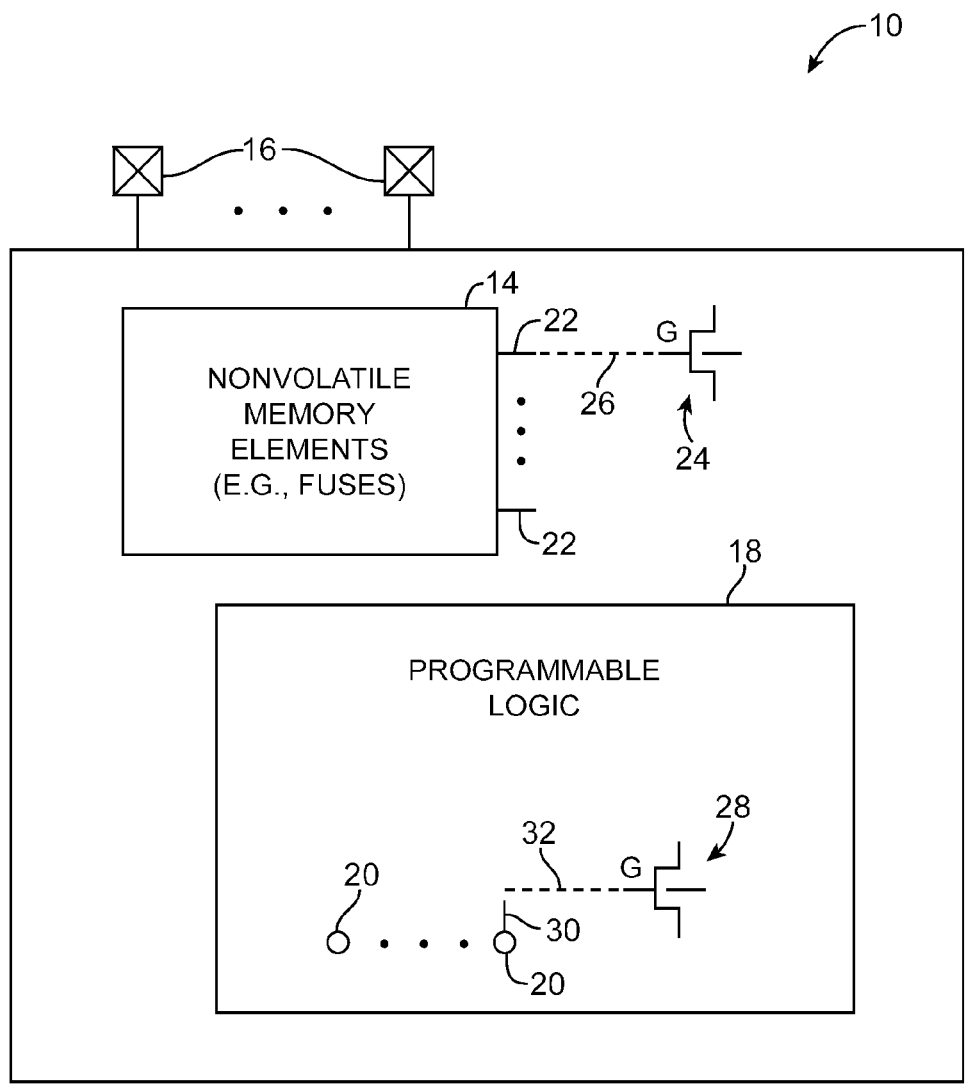
FIG. 1 is a diagram of an illustrative integrated circuit that includes nonvolatile memory element circuitry in accordance with an embodiment of the present invention.

An illustrative integrated circuit that may include nonvolatile memory elements is shown in FIG. 1. As shown in FIG. 1, integrated circuit 10 may have input-output pins 16. Input-output pins 16 may be used to receive power and data signals for integrated circuit 10 and may be used to convey internal signals from within integrated circuit 10 to external circuitry. In a typical scenario, integrated circuit 10 may be mounted to a printed circuit board in a system. Traces on the printed circuit board may be used to convey power and data signals to integrated circuit 10. Traces on the printed circuit board may also be used to convey output data from integrated circuit 10 to other system components.

Integrated circuit 10 may be a programmable integrated circuit such as a programmable logic device integrated circuit, an application-specific integrated circuit (ASIC), a digital signal processing circuit, a microprocessor, a memory chip, an audio or video integrated circuit, or any other suitable integrated circuit. Scenarios in which integrated circuit 10 is a programmable integrated circuit such as a programmable logic device integrated circuit are sometimes described herein as an example. This is, however, merely illustrative.

As shown in FIG. 1, integrated circuit 10 (e.g., a programmable logic device integrated circuit) may have programmable logic 18. Programmable logic 18 may include transistors such as transistor 28 that can be controlled by static control signals from programmable memory elements 20. Programmable memory elements 20 may be, for example, random-access memory (RAM) cells that are loaded with configuration data. Once loaded, each memory element 20 may produce a corresponding static output control signal on its output 30. For example, a memory element that has been loaded with a logic one may produce a logic one on its output 30 (i.e., a positive voltage Vcc). A memory element that has been loaded with a logic zero may produce a logic zero on its output 30 (i.e., a ground voltage Vss).

Interconnect lines such as line 32 may be used to route the static control signals that are produced by memory elements 20 to programmable logic components. As an example, lines such as line 32 may be coupled to the gates G of metal-oxide-semiconductor (MOS) transistors on device 10 to control their state. If line 32 conveys a positive voltage Vcc to gate G of an n-channel MOS (NMOS) transistor 28, that transistor 28 will be turned on. If line 32 conveys a ground voltage Vcc to the gate G of an NMOS transistor, that transistor will be turned off. P-channel metal-oxide-semiconductor (PMOS) transistors may also be used in programmable logic 18 (e.g., as power-down transistors that place blocks of unused circuitry in sleep mode when not in active use).

The NMOS and PMOS transistors of integrated circuit 10 may be part of circuits such as multiplexers, look-up tables, switches, and other configurable logic components. A user who desires to implement a custom logic design can use a computer-aided design (CAD) tool to generate a set of corresponding configuration data for that design. When the configuration data is loaded into programmable elements 20, the configuration data will control the states of transistors such as transistor 28 in the example of FIG. 1 and will program integrated circuit 10 to perform the desired custom logic function. Configuration data loading operations can be performed upon system power-up (e.g., using a configuration data loading chip that is mounted on the same printed circuit board as integrated circuit 10).

In addition to using memory elements 20 (e.g., volatile memory elements) that are loaded with user-generated configuration data, integrated circuit 10 may use nonvolatile memory elements 14. Nonvolatile memory elements 14 may be based on fuses or antifuses. In their unprogrammed state, fuses exhibit a low resistance (i.e., a closed circuit condition). Following programming to blow a fuse, the fuse exhibits a high resistance (i.e., an open circuit condition). Antifuses are initially in a high resistance state and exhibit low resistance following programming. For clarity, the operation of nonvolatile memory elements 14 of FIG. 1 is typically described herein in the context of fuses, but antifuse memory elements may be used if desired. The use of fuses to implement nonvolatile memory element circuitry on device 10 is merely illustrative. Moreover, the use of a programmable integrated circuit such as a programmable logic device integrated circuit for integrated circuit 10 is also merely illustrative. Any suitable integrated circuit may contain nonvolatile memory element circuitry 14 if desired.

Nonvolatile memory elements can be used to store complex programming data (e.g., for configuring complex programmable logic circuitry on a programmable integrated circuit). In many situations, however, less complex programming tasks are required. For example, on many integrated circuits (including programmable logic device integrated circuits such as programmable logic device integrated circuit 10 of FIG. 1), there is a need for permanently storing a relatively small amount of data on the integrated circuit. The data may be used for storing a serial number or other identification information, may be used for implementing a binning scheme in which certain features on an integrated circuit are selectively turned off, or may be used in implementing a redundancy scheme (e.g., to adjust the settings of bypass switches that switch redundant circuitry into place to repair circuitry that has been identified as defective during testing).

In applications such as these, it may be necessary to permanently load data onto a given integrated circuit, so that the loaded data (e.g., redundancy settings, etc.) will be retained, even in the event that the integrated circuit is not powered. Permanency (nonvolatility), which is requirement in these applications, can be achieved by permanently altering the physical structures of nonvolatile elements 14 during programming operations.

Initially, elements 14 are not programmed. In this situation, elements 14 will exhibit a first resistance state (e.g., a low resistance). Following programming, elements 14 will exhibit a second resistance state (e.g., a high resistance). The first and second resistance states are distinct and can be sensed using sensing circuitry. Correspondingly distinct static output control signals can then be provided on control outputs 22. The control signals on outputs 22 may, in turn, be applied to configurable circuitry such as the gate G of transistor 24 using paths such as path 26. Configurable circuitry 24 may be part of programmable logic 18 or may be part of another circuit (e.g., a circuit that is not typically referred to as programmable logic such as a redundancy control circuit, binning circuit, or chip identification circuit, etc.).

In integrated circuits such as illustrative integrated circuit 10 of FIG. 1 that contain both volatile and nonvolatile memory elements, it may be advantageous for nonvolatile settings to be adjusted by a manufacturer and for volatile configuration data that has been created by a logic designer to be loaded by an end user. For example, a manufacturer may test a newly fabricated integrated circuit as part of final device testing. If repairable defects are detected in particular circuits, the manufacturer may program nonvolatile memory elements 14 accordingly (e.g., to permanently switch redundant circuitry into use to replace the circuits that contain the defects). Later, during use in system by an end user, a logic designer's custom logic design can be loaded into memory elements 20 (e.g., at power up). The nonvolatile memory elements that were programmed by the manufacturer will ensure that the loaded programming data will be routed into appropriate memory elements 20. Once elements 20 have been loaded and associated programmable logic 18 has been configured accordingly, the end user may use the custom logic functions of the integrated circuit.

If desired, nonvolatile memory elements 14 may be used in circuit applications that do not include programmable logic 18. For example, nonvolatile memory elements 14 may be used to adjust the settings of an analog integrated circuit (e.g., to trim a resistor in a radio-frequency circuit). The use of nonvolatile memory elements 14 in integrated circuit 10 of FIG. 1 is merely illustrative.

Figure 2:
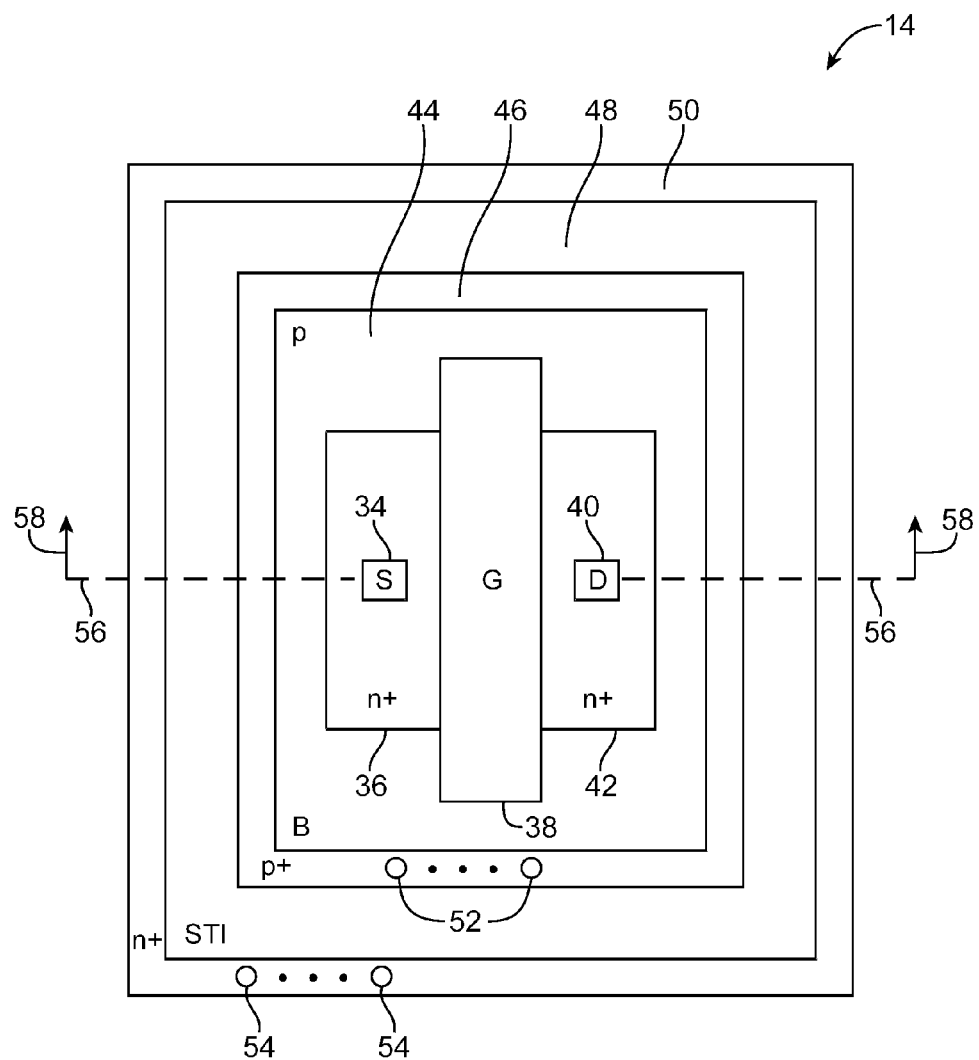
FIG. 2 is a top view of an illustrative nonvolatile memory element in accordance with an embodiment of the present invention.

FIG. 2 shows a top view of an illustrative nonvolatile memory element 14. Nonvolatile memory element 14 of FIG. 1 is based on a metal-oxide-semiconductor transistor structure with four terminals—source terminal S, drain terminal D, gate terminal G, and body terminal B. Memory element 14 may be formed from a semiconductor such as silicon, so silicon-based memory elements are sometimes described herein as an example.

As in metal-oxide-semiconductor transistor structures, source S and drain D of memory element 14 may be formed from conductive electrodes (e.g., metal electrodes) that make ohmic contact to respective doped semiconductor regions. As shown in FIG. 2, for example, source S may have a metal source electrode structure 34 (e.g., a source electrode in the shape of a vertical column having lateral dimensions of about 54×54 nm) that makes ohmic contact to a source diffusion (n+ doped region 36) and drain D may have a metal drain electrode structure 40 that makes ohmic contact to a drain diffusion (n+ doped region 42). The doped regions in device 14 may be formed by ion implantation or other suitable semiconductor fabrication processes (e.g., diffusion, epitaxial growth, chemical vapor deposition, etc.).

During programming events, current is passed through the source electrode, causing the source electrode to "blow" and enter a high resistance state. Unlike conventional MOS transistors in which it is desired to form relatively low-resistance paths to the source diffusion, in nonvolatile memory element 14 it is generally desirable to increase the resistance of the source electrode path to enhance localized source electrode heating and thereby facilitate programming. There may therefore only be a single conductive electrode 34 that makes contact with source diffusion 36, rather than multiple source electrodes connected to the source diffusion in parallel as in conventional MOS devices.

Body terminal B may be formed from body region 44. Body region 44, which is sometimes referred to as a well region or well, may be formed from a well of p-type silicon. P+ ring 46 and body contacts 52 may be used to make ohmic contact to body B. Shallow trench isolation (STI) region 48 may form an isolating ring around body contact ring 46. Underlying n-type isolation structures may also help electrically isolate p-type body B from surrounding devices. Ring 50 (e.g., an n+ silicon region) and associated contacts 54 may form an electrical contact to the underlying n-type isolation structures and a deep n-well that runs under device 14. Ring 50 may be biased at a positive voltage (e.g., an input-output positive power supply voltage Vccio voltage of 2.5 volts) to help reverse bias region 50 and the deep n-well relative to relative to body B (i.e., to reverse bias the body-to-n-well p-n junction). With this type of reverse bias in place, region 50 and the other n-regions that surround p-type body region 44 may help electrically isolate body region 44 and therefore nonvolatile memory element 14 from surrounding devices.

Figure 3:
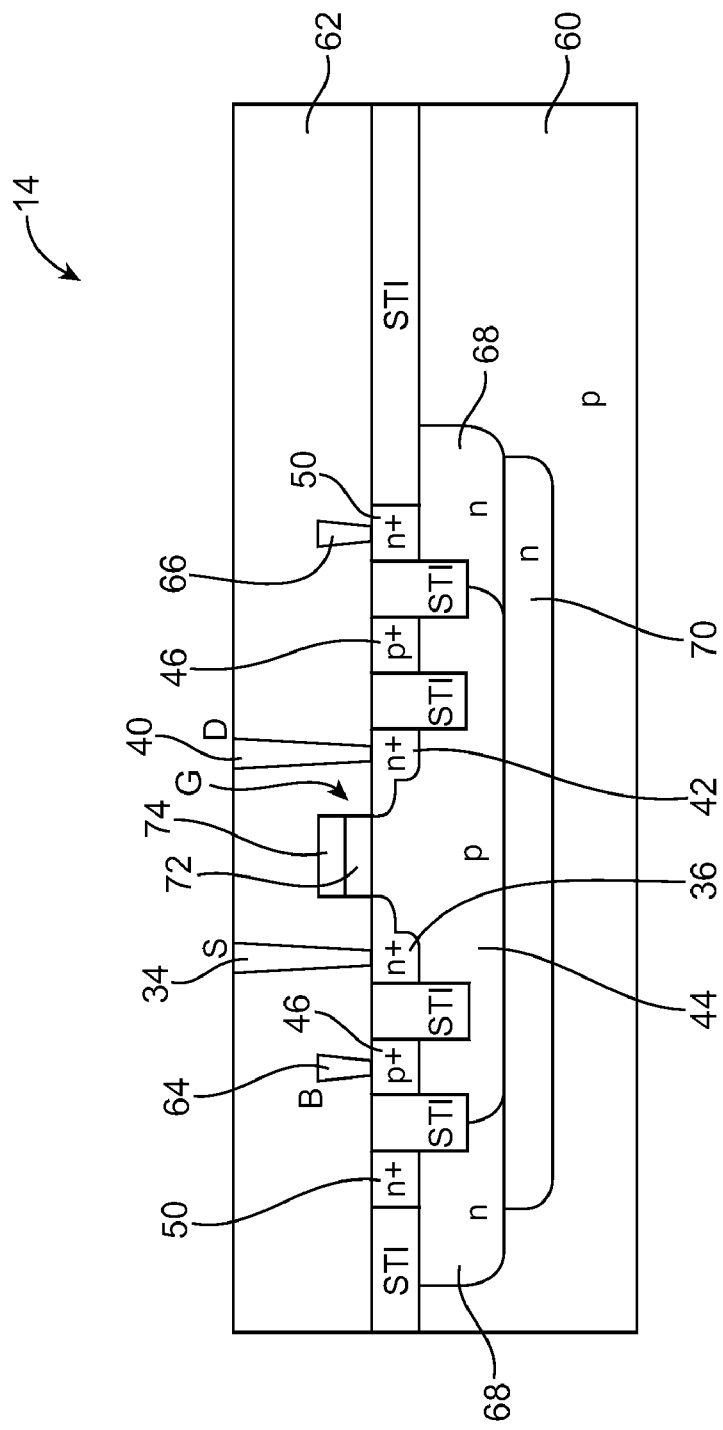
FIG. 3 is a cross-sectional side view of an illustrative nonvolatile memory element of the type shown in FIG. 2 in accordance with an embodiment of the present invention.

A cross-sectional side view of memory element 14 of FIG. 2, taken along line 56 of FIG. 2 and viewed in direction 58 is shown in FIG. 3. As shown in FIG. 3, memory element 14 may be formed in a semiconductor (silicon) substrate 60. Dielectric layers (shown schematically as layer 62 in FIG. 3) may be formed on top of substrate 60 and may be used to provide insulation for conductive structures such as source electrode 34 and drain electrode 42. Dielectric 62 may be formed from silicon oxide, polymers, or other suitable dielectric materials. Source and drain electrodes 34 and 40 may be formed from metal such as tungsten or other suitable conductors and may make ohmic contact with underlying doped regions 36 and 42, respectively.

Electrode 64 may be used to form an ohmic contact to ring-shaped body region 46, which is electrically connected to body region 44. Electrode 66 may be used to form an ohmic contact to ring-shaped n+ region 50, which is connected to ring-shaped n-type region 68 and deep n-well 70. Electrode 66 may be biased at a positive voltage of 2.5 volts or other suitable positive voltage to help isolate memory element 14 from its environment. Shallow trench isolation (STI) may also be used to isolate semiconductor regions in memory element 14 from each other at the surface of substrate 60.

Gate G may include a gate conductor 74 formed from metal or other suitable conductive materials and a gate insulator 72 formed from silicon oxide, a high-K material (e.g., a hafnium-based dielectric or a high-k dielectric based on other materials), or other suitable insulator. An example of a conductive material that may be used for the gate is doped polysilicon. Another example of a conductive material that may be used for the gate is metal.

For optimum circuit performance, it may be desirable to form the gate insulator layer of the MOS transistors on a given integrated circuit from a high-K dielectric and to form the gate conductor of the MOS transistors from a metal (e.g., an elemental metal or a metal compound that is formed from one or more metals and optional additional elements such as nitrogen—sometimes collectively referred to as gate metal). In arrangements such as these, there is no need to include a polysilicon layer for use in forming MOS transistor gate conductors. To ensure process compatibility, it may therefore be desirable to form gate conductor G from a metal and gate oxide 72 from a high-K material in memory element 14.

Figure 4A:
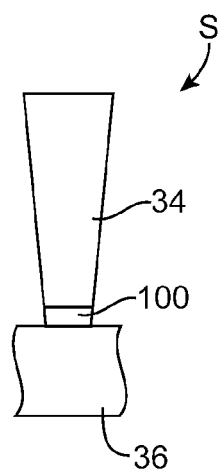
FIG. 4A is a cross-sectional side view of a source electrode in a nonvolatile memory element of the type shown in FIGS. 2 and 3 before programming operations have been performed in accordance with an embodiment of the present invention.

A cross-sectional side view of structures associated with source S in a memory element of the type shown in FIGS. 2 and 3 is shown in FIG. 4A. As shown in FIG. 4A, there may be one or more relatively thin layers of material 100 interposed between source electrode 34 and source diffusion 36. Material 100 may help promote adhesion of source electrode 34 to source diffusion 36 and/or may serve as a diffusion barrier.

Figure 4B:
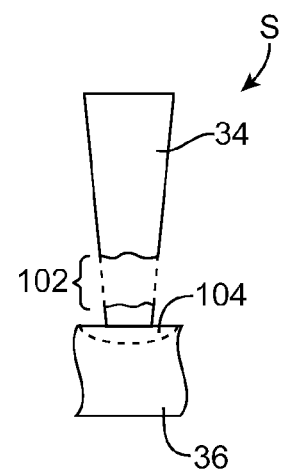
FIG. 4B is a cross-sectional side view of the source electrode of FIG. 4A following programming to place the memory element in a high resistance state in accordance with an embodiment of the present invention.

Initially, prior to memory element programming, the structures of FIG. 4A are intact. To program memory element 14, a current is passed through source electrode 34. The current that flows through electrode 34 heats electrode 34. When heated sufficiently, some of electrode 34 is removed to form void 102, as shown in FIG. 4B. Some of the material of electrode 34 (and possibly some of layer 100) may also diffuse into upper region 104 of source diffusion 36 when electrode 34 is heated.

The alterations to the structures of source S such as the formation of voice 102 in electrode 34 cause electrode 34 and source S to permanently (irreversibly) develop a high resistance. In its unprogrammed state of FIG. 4A, electrode 34 is intact and the resistance of source S is relatively low. Following programming, the resistance of electrode 34 and source S becomes elevated (e.g., by a factor of about $10^5$ or more). This Roff/Ron ratio compares favorably to the ratio of Roff to Ron of conventional polysilicon fuses (typically 1000 or less).

Figure 5:
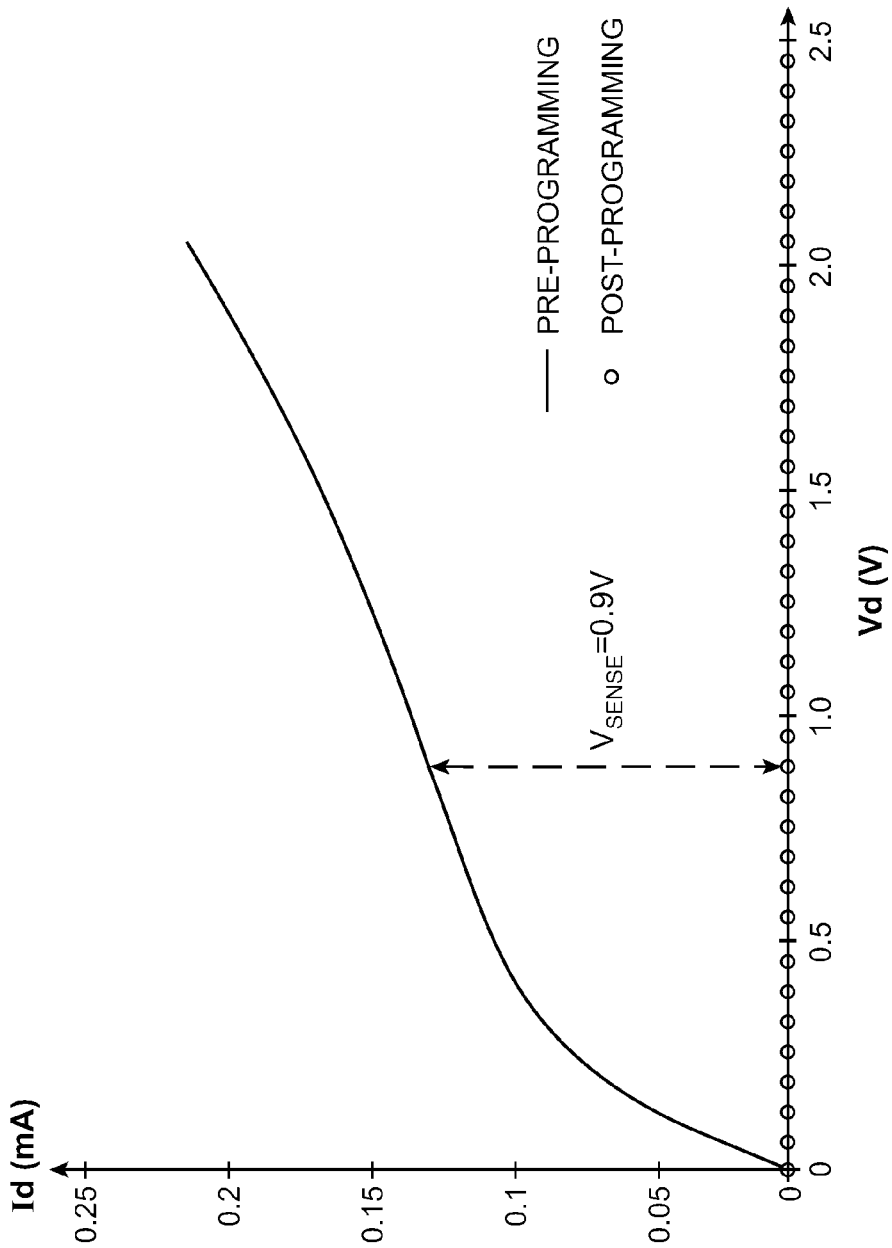
FIG. 5 is a graph showing how the magnitude of the source-drain current in a nonvolatile memory element of the type shown in FIGS. 2 and 3 varies as a function of applied drain voltage before and after programming operations in accordance with an embodiment of the present invention.

A graph showing the current that flows through source S (Id) as a function of applied voltage (Vd) for memory element 14 in its programmed and unprogrammed states is shown in FIG. 5. When unprogrammed, the resistance of memory element 14 is relatively low and a substantial current (e.g., more than 0.1 mA in a typical configuration) may flow upon application of a typical sensing voltage (e.g., when a voltage Vd of 0.9 volts is applied). Following programming, the resistance of memory element 14 is substantially increased, so the current that flows upon application of a voltage Vd equal to 0.9 volts is about 0.1 mA divided by $10^5$ (i.e., 1 nA). Sensing circuitry on device 10 can detect this difference in resistance and can convert the detected resistance state of each memory element into a corresponding digital control signal. When the sensing circuitry detects that the resistance of a given memory element is low, the sensing circuitry can supply a corresponding logic output value at a first level (e.g., a logic "0" or a logic "1"). When the sensing circuitry detects that the resistance of the given memory element is high, the sensing circuitry can reflect this situation by producing a logic output at a second level (i.e., a logic value that is complementary to the logic value of the first level). These sensing circuitry outputs can be used as static output control signals (i.e., these outputs can be supplied to the gates of transistors on device 10 such as transistor 24 using lines such as line 26 of FIG. 1).

Memory element 14 can be programmed by applying a current through source electrode 34 that is sufficient to heat electrode 34 and create a corresponding rise in resistance (e.g., by creating void 102 of FIG. 4B). Any suitable programming circuitry may be used to control the application of programming signals to memory element 14. For example, each memory element 14 (e.g., each fuse) on device 10 may be provided with a corresponding programming control transistor such as transistor TP of FIG. 6. When it is desired to program the fuse that is connected to a given transistor TP, the gate GP of that transistor may be taken high by application of an associated control signal. When gate GP of NMOS transistor TP is taken high, a programming current will flow from positive power supply terminal Vccio (e.g., a supply at 2.5 volts) to ground node Vss (e.g., a ground power supply terminal at 0 volts) through source S of fuse 14. This current will program memory element 14.

Figure 6:
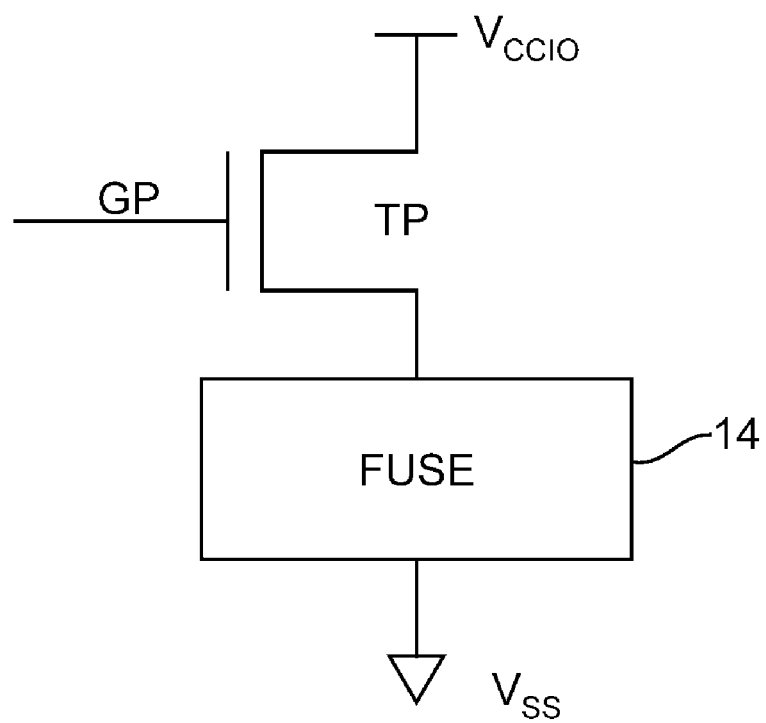
FIG. 6 is a circuit diagram of an illustrative programming circuit that may be used to program a nonvolatile memory element in accordance with an embodiment of the present invention.

Satisfactory operation of programming circuitry of the type shown in FIG. 6 generally involves the use of transistors TP that are sufficiently large to handle expected levels of programming current. It may therefore be desirable to program memory element 14 using a programming circuit that takes advantage of the inherent parasitic bipolar transistor that is present in MOS-type structures such as memory element 14 of FIGS. 2 and 3. As shown in FIG. 3, memory element 14 has an n-type source S and an n-type drain D (sometimes collectively referred to as source-drain terminals), a p-type body B, and a gate G. The source S forms a parasitic emitter, the drain D forms a parasitic collector, and the body B forms a parasitic base for a parasitic npn bipolar transistor. The behavior of this parasitic bipolar transistor comes into effect during programming and helps make it possible to program memory element 14 at relatively low programming voltages (e.g., with a positive power supply voltage of 2.5 volts or less). In particular, the so-called bipolar breakdown effect of the parasitic bipolar transistor may be used to create a relatively large source current without requiring large voltages (e.g., voltages of 4.5 volts which might be required for inducing simple junction breakdown).

The amount of current that flows through the channel region under gate G of memory element 14 when memory element 14 is operated as a normal MOS transistor may not be sufficient to program memory element 14. To increase the amount of current that flows through source S, parasitic bipolar collector-to-base breakdown may be induced (e.g., using an applied voltage of 4.5 volts). To reduce or eliminate the need for a 4.5 volt programming voltage, the collector-to-emitter breakdown behavior of the parasitic bipolar transistor may be used. The voltage associated with the breakdown of the collector to the emitter in the parasitic bipolar when the body terminal B is floating (i.e., when B is not tied to a known potential such as ground or Vcc) is referred to as the breakdown voltage of the collector to emitter with base open (BVCEO). There is a gain $\beta$ that is equal to about 3 for typical complementary-metal-oxide-semiconductor (CMOS) transistor-type structures of the type shown in FIGS. 2 and 3 for memory element 14. During collector-to-emitter breakdown events with a floating body, the breakdown voltage BVCEO is lowered by about the inverse of the square root of $\beta$. This reduction helps reduce the required programming voltage for breakdown when programming memory element 14, thereby reducing or eliminating the need for additional high-voltage power supplies for integrated circuit 10.

Figure 7:
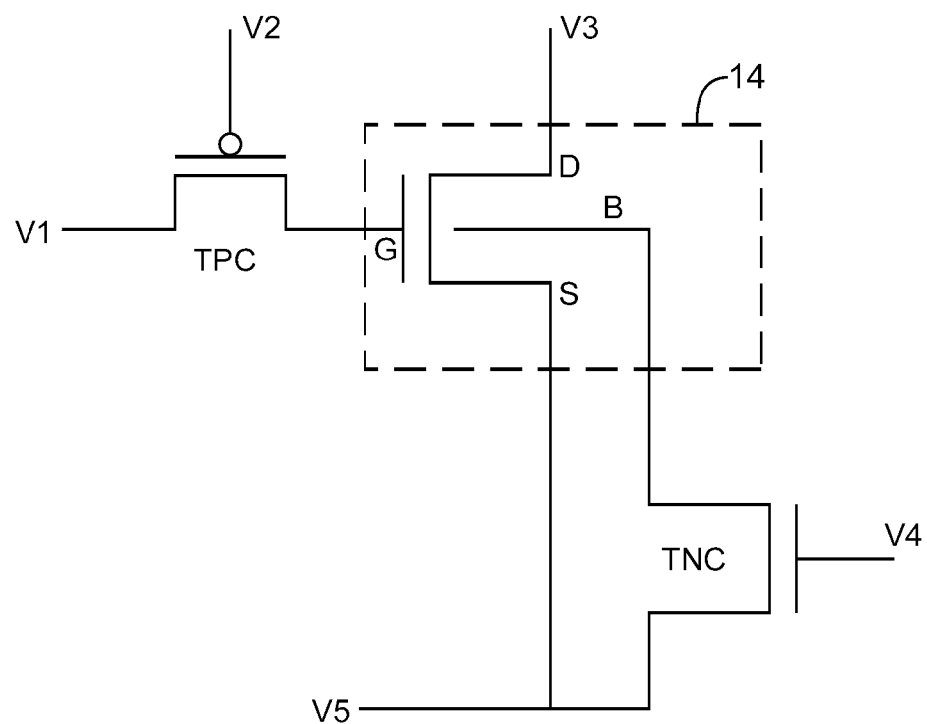
FIG. 7 is a circuit diagram of an illustrative memory element and associated control circuitry showing signals that may be applied to the terminals of the memory element during programming and sensing operations in accordance with an embodiment of the present invention.

The illustrative programming control circuitry of FIG. 7 includes a p-channel metal-oxide-semiconductor (PMOS) control transistor TPC and an n-channel metal-oxide-semiconductor (NMOS) control transistor TNC. Voltages V1, V2, V3, V4, and V5 may be applied to memory element 14 during programming and sensing operations using programming and sensing control circuitry 106 of FIG. 8.

Figure 8:
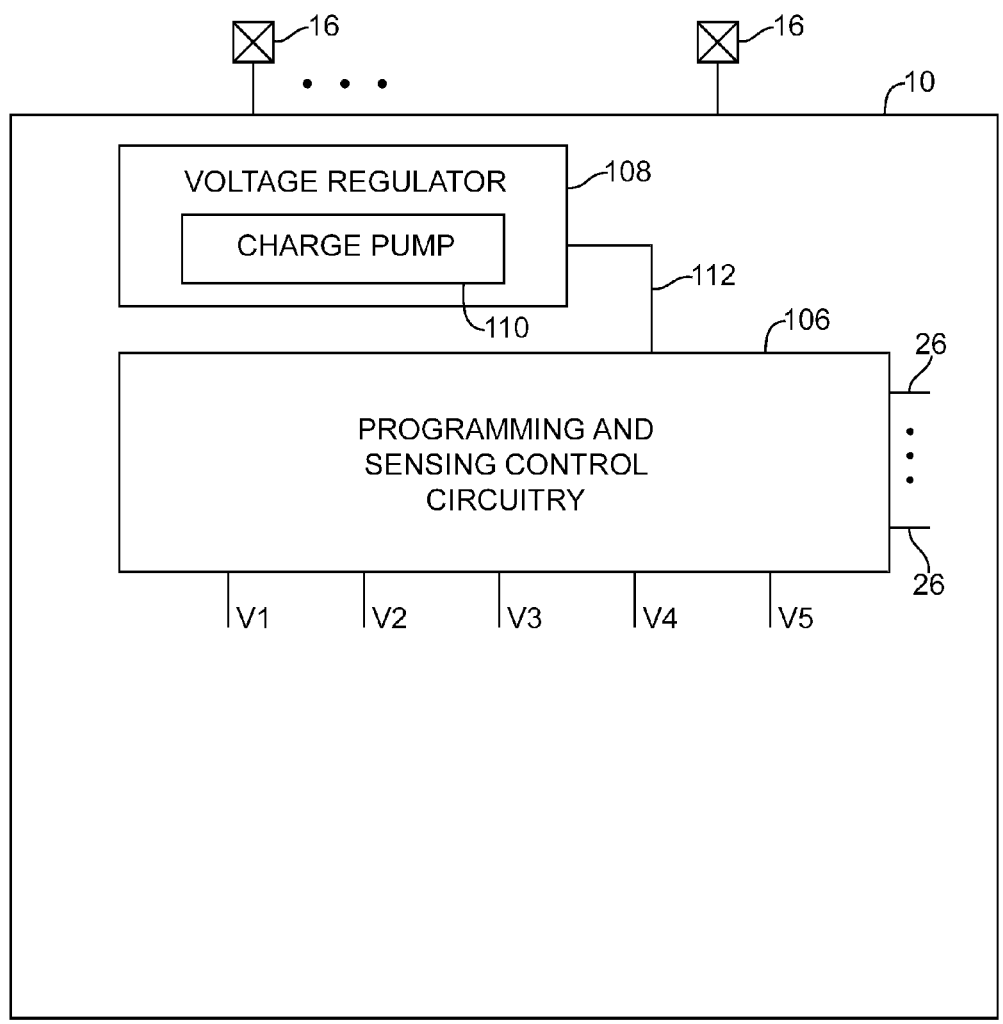
FIG. 8 is a diagram of an illustrative integrated circuit that includes circuitry for programming nonvolatile memory elements and for sensing the state of nonvolatile memory elements in accordance with an embodiment of the present invention.

As shown in FIG. 8, integrated circuit 10 may have input-output pins 16 that are used in receiving external power supply voltages and that are used in handling input and output data signals. To reduce the number of required external supplies that are needed to support operation of integrated circuit 10, integrated circuit 10 may, if desired, be provided with internal power supply circuits. For example, integrated circuit 10 may have a voltage regulator 108 that includes a charge pump 110. Charge pump 110 may receive ground and positive power supply voltages as inputs and may produce a corresponding negative voltage as an output. Voltage regulator 108 may include power regulator circuitry that regulates the magnitude of the negative voltage produced by charge pump 110 (as an example).

Programming and sensing control circuitry may by interface with memory element 14 of FIG. 7 using the lines that are labeled V1, V2, V3, V4, and V5 in FIG. 8. During sensing operations, the current flowing through source S may be measured and a corresponding output signal on one of lines 26 may be asserted. When the measured current flow is high, programming and sensing control circuitry 106 may take the control line to one logic state (e.g., a logic one or zero), whereas control circuitry 106 may take the control line to a complementary logic state (e.g., a logic zero or a logic one) when the measured current flow is low.

Illustrative voltages V1, V2, V3, V4, and V5 that are associated with programming and sensing operations are shown in the table of FIG. 9. As shown in the first column of the table of FIG. 9, during device programming voltages V1 and V2 may be held at a positive voltage of about 0.9 volts (e.g., a power supply Vcc that is associated with operating the normal digital logic on integrated circuit 10), so that the gate G effectively floats. Floating gate coupling helps the parasitic bipolar transistor initiate breakdown. Voltage V3, which is sometimes referred to as the programming voltage for memory element 14, may be held at a value of 2.5 volts (as an example). This voltage level may, for example, be a level that is commonly available for powering input-output buffer circuitry around the periphery of integrated circuit 10. Although higher voltages could be used for voltage V3, the ability to program memory element 14 using only a 2.5 volt supply may be advantageous because potentially complex power supply requirements are minimized or eliminated.

Voltage V5 at the source S of memory element 14 may be held at a negative voltage. This voltage may be, for example, a voltage that is available on integrated circuit 10 for other purposes (e.g., a reverse body bias that is used in reducing leakage currents in NMOS transistors on device 10 such as transistors 28 and 24 of FIG. 1). The value of V5 may be −0.1 volts or less (i.e., more negative than −0.1 volts), −0.2 volts or less, −0.3 volts or less, or −0.5 volts or less (as examples). By reducing the voltage V5, the magnitude of the voltage drop between V3 and V5 can be increased without requiring V3 to be increased above 2.5 volts.

The voltage V4 can be held at a voltage of less than or equal to that of V5. For example, if V5 is −0.5 volts, V4 can be held at −0.5 volts. This helps ensure that NMOS transistor TNC will be off and thereby ensures that body B floats, providing the $1/\sqrt{\beta}$ reduction in the magnitude of the required programming voltage that arises from using the collector-to-emitter breakdown properties of the parasitic bipolar transistor (BVCEO). The programming current for a typical memory element using this type of programming signal arrangement is about 30 mA or less (applied for about 10 μs).

The reduction in the required magnitude of the programming voltage (V3-V5) that is achieved through use of the parasitic bipolar characteristics of memory element 14 arises from the floating body B that is used during programming. When programming, the positive applied voltage V3 gives rise to a current flowing through drain D into body B. There is a relatively high electric field at the drain-body junction that leads to impact ionization events in the vicinity of the junction. Electrons that result from the impact ionization events are gathered into drain D, but holes that result from the impact ionization events flow across body B into source S. The presence of the holes and associated positive charge build up in body B in the vicinity of the body-source junction slightly forward biases the body-source junction and allows body-source current to flow. In the bipolar model, this body-source current flow corresponds to a non-zero emitter current (i.e., the applied programming voltage has turned on the bipolar aspect of the memory element structure). When the parasitic bipolar transistor becomes active in this way, the β of the parasitic bipolar contributes to current flow and helps reduce the magnitude required for the programming voltage. Had body terminal B been grounded during programming rather than floating, the holes would not have resulted in a forward-biased body-emitter junction, but rather would have been picked up by the body contact.

During sensing, the signal voltage V1 may be held at 0.9 volts and voltage V2 may be held at 0 volts. With V2 at 0 volts, transistor TPC is turned on and the 0.9 volt signal (V1) is conveyed to gate G to turn on the transistor structure of memory element 12. A 0.9 volt power supply voltage may be applied to drain D. At the same time, transistor TNC may be turned on by taking V4 to 0.9 volts. Voltage V5 may be held at 0 volts to ground source S and (through transistor TNC) body B. While these sensing control signals are being applied to memory element 14 by programming and sensing control circuitry 106, the current flow through memory element 14 may be measured by circuitry 106 (e.g., by monitoring the current flowing through the V3 and/or V5 lines). If the memory element has been programmed, the measured current flow through drain D and source S will be about $10^5$ times smaller than if the memory element has not been programmed (i.e., memory element 14 will typically exhibit an Roff/Ron ratio of about $10^5$).

Figure 10:
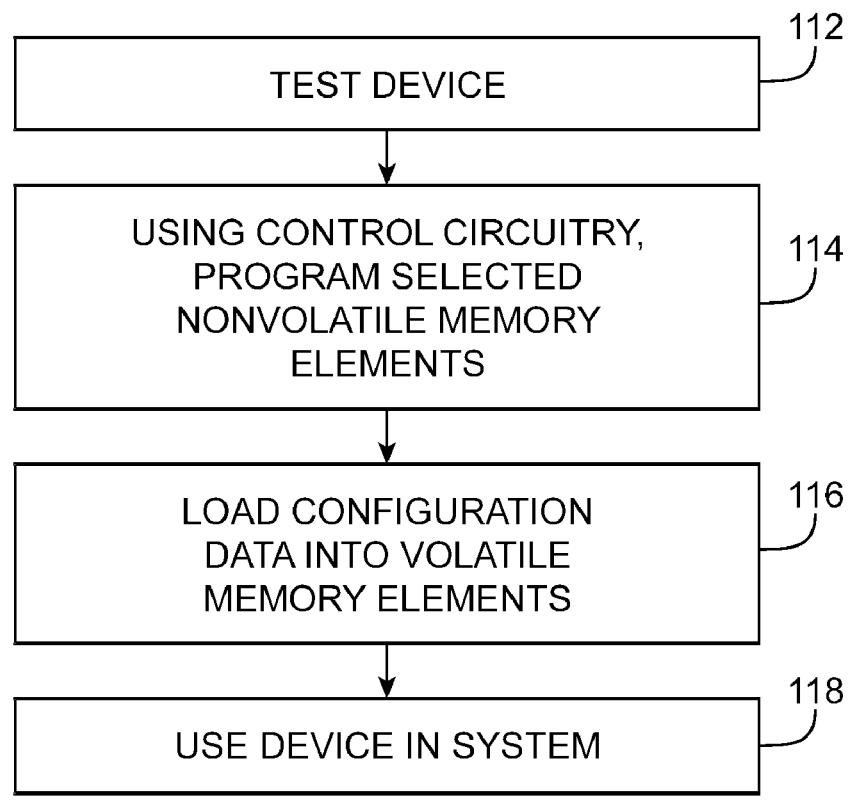
FIG. 10 is a flow chart of illustrative steps involved in programming circuitry on an integrated circuit and using the programmed integrated circuit in a system in accordance with an embodiment of the present invention.

Illustrative operations involved in using nonvolatile memory elements 14 in integrated circuit 10 are shown in FIG. 10. In a typical scenario, integrated circuit 10 is fabricated at a manufacturer. The integrated circuit that is manufactured may have spare circuits to allow the circuit to be repaired if certain defects are detected. Following initial fabrication, integrated circuit 10 can be tested (step 112). Integrated circuit 10 can be tested using a testing tool either before or after integrated circuit 10 has been packaged. Testing may reveal that integrated circuit 10 is defect free or may result in the identification of repairable defects. The testing tool or other computing equipment may then be used to automatically determine which redundant circuitry is to be switched into place and to determine appropriate settings for nonvolatile memory elements 14 on integrated circuit 10.

At step 114, a programming tool or other tool based on computing equipment may be used to load programming data into nonvolatile memory elements 14. For example, the programming tool may convey a set of settings for nonvolatile memory elements 14 to programming and sensing control circuitry 106. Integrated circuit 10 may also be supplied with power supply voltages. Additional power supply voltages may, if desired, be generated on integrated circuit 10 (e.g., using voltage regulator 108 of FIG. 8.

Programming data for nonvolatile memory elements 14 and power supply voltages may be supplied to integrated circuit 10 from the programming tool using input-output pins 16. Programming and sensing control circuitry 106 may receive the programming data from the programming tool and may program nonvolatile memory elements 14 accordingly, as described in connection with FIGS. 7-9. For example, collector-emitter breakdown can be induced in the nonvolatile memory by floating body B using control transistor TNC while simultaneously causing sufficient current to flow through source S. This will alter the structure of source S (e.g., by creating a void or other current-blocking structures such as cracks in the source electrode) and will give rise to an increase in resistance in the source electrode. If desired, some or all of the voltages V1, V2, V3, V4, and V5 that are used during programming may be provided from the programming tool (e.g., by routing these signals to memory element 14 and the programming and sensing control circuitry formed from programming and sensing control transistors TPC and TNC directly).

During the programming operations of step 114, collector-to-emitter breakdown in the parasitic bipolar transistor of nonvolatile memory elements 14 can be induced by floating body B using the illustrative control voltages of FIG. 9. This allows memory elements 14 to be programmed at lower voltages than would otherwise be possible. The memory elements may be programmed with redundancy repair settings, serial number data, data for implementing binning schemes, access codes or other security data, date information, manufacturing data, or any other suitable data. This data will remain present on integrated circuit 10 even when circuit 10 is not powered.

In integrated circuits such as integrated circuit 10 of FIG. 1 that contain programmable elements 20 (e.g., RAM cells), configuration data (programming data) can be loaded into the programmable elements at step 116. The loading operations of step 116 may, for example, be performed after device 10 has been installed in a system and is being provided with configuration data from an associated configuration data loading chip. By loading configuration data into device 10, the programmable logic of device 10 (e.g., programmable logic 18 of FIG. 1) may be configured to perform a custom logic function.

After nonvolatile memory elements 14 have been programmed and any desired configuration data has been loaded into memory elements 20, integrated circuit 10 may be used in a system (step 118).

The foregoing is merely illustrative of the principles of this invention and various modifications can be made by those skilled in the art without departing from the scope and spirit of the invention.

What is claimed is:

1. Nonvolatile memory element circuitry, comprising:
   a metal-oxide-semiconductor transistor structure having a drain, a source, and a body, wherein the drain, source, and body form a parasitic bipolar transistor during programming operations, wherein there is a resistance associated with the source, and wherein the resistance has a given resistance level when the metal-oxide-semiconductor transistor structure is unprogrammed; and
   control circuitry coupled to the metal-oxide-semiconductor transistor structure operable to apply a voltage between the drain and source while floating the body so that the parasitic bipolar transistor exhibits collector-emitter breakdown and so that the resistance associated with the source is increased to a level that is greater than the given resistance level.

2. The nonvolatile memory element circuitry defined in claim 1 wherein the control circuitry is operable to apply a positive voltage to the drain and a negative voltage to the source during the programming operations.

3. The nonvolatile memory element circuitry defined in claim 1 wherein the control circuitry is operable to induce sufficient current flow through the source to create a void in the source during the programming operations.

4. The nonvolatile memory element circuitry defined in claim 1 wherein the control circuitry includes a transistor having a first terminal coupled to the body, a second terminal coupled to a negative voltage source, and a gate terminal operable to receive a control signal having a first value during the programming operations and a second value during sensing operations.

5. The nonvolatile memory element circuitry defined in claim 4 wherein the transistor comprises an n-channel metal-oxide-semiconductor transistor and wherein the first value is a negative voltage.

6. The nonvolatile memory element circuitry defined in claim 4 wherein the transistor comprises an n-channel metal-oxide-semiconductor transistor and wherein the second value is a positive voltage.

7. The nonvolatile memory element circuitry defined in claim 6 wherein the transistor comprises an n-channel metal-oxide-semiconductor transistor and wherein the first value is a negative voltage.

8. The nonvolatile memory element circuitry defined in claim 1 wherein the control circuitry comprises:
   an n-channel metal-oxide-semiconductor transistor having a first terminal coupled to the body, a second terminal coupled to a negative voltage source during the programming operations, and a gate terminal operable to receive a control signal having a first value during the programming operations and a second value during sensing operations; and
   a p-channel metal-oxide-semiconductor transistor having a first terminal coupled to a gate of the metal-oxide-semiconductor transistor structure, having a second terminal operable to receive a positive voltage, and having a gate terminal operable to receive a control signal.

9. A method for using an integrated circuit containing a nonvolatile memory element that has a metal-oxide-semiconductor transistor structure having a drain terminal, a source terminal, and a body terminal, wherein there is a resistance associated with the source terminal and wherein the resistance has a given resistance level prior to programming operations, comprising:
   during the programming operations, applying a voltage between the drain terminal and source terminal while floating the body terminal so that a parasitic bipolar transistor formed from the drain terminal, the source terminal, and the body terminal exhibits collector-emitter breakdown between the source terminal and the drain terminal and so that the resistance associated with the source terminal is increased to a level that is greater than the given resistance level.

10. The method defined in claim 9 further comprising:
    during sensing operations, applying a voltage across the drain terminal and the source terminal.

11. The method defined in claim 10 further comprising:
    with an n-channel metal-oxide-semiconductor transistor, applying a ground voltage to the body terminal while applying the voltage across the drain terminal and the source terminal during sensing operations.

12. The method defined in claim 9 wherein the metal-oxide-semiconductor transistor structure of the memory element has a gate, the method further comprising:
    during sensing operations, applying a positive voltage to the gate.

13. The method defined in claim 9 wherein applying the voltage between the drain terminal and source terminal while floating the body terminal comprises applying a positive voltage to the drain terminal and applying a negative voltage to the source terminal.

14. The method defined in claim 13 wherein applying the negative voltage to the source terminal comprises applying a negative voltage with a value of less than −0.3 volts to the source terminal.

15. The method defined in claim 13 wherein the integrated circuit comprises a programmable integrated circuit containing a plurality of programmable logic transistors each of which is operable to receive a static control signal from a respective random-access-memory cell, the method further comprising:
   loading configuration data into the random-access-memory cells to customize the programmable integrated circuit.

16. Nonvolatile memory element circuitry, comprising:
   a nonvolatile memory element that includes a metal-oxide-semiconductor transistor structure having a drain electrode, a source electrode, a gate having a gate conductor and a gate insulator, and a body region, wherein there is a resistance associated with the source electrode and wherein the resistance has a given resistance level when the nonvolatile memory element is unprogrammed; and
   control circuitry coupled to the metal-oxide-semiconductor transistor structure operable to apply a voltage between the drain electrode and source electrode while floating the body region so that the metal-oxide-semiconductor transistor structure exhibits breakdown between the source electrode and the drain electrode that causes sufficient current flow through the source electrode to irreversibly increase the resistance associated with the source electrode to a level that is greater than the given resistance level.

17. The nonvolatile memory element circuitry defined in claim 16 wherein the source electrode comprises a single column of metal.

18. The nonvolatile memory element circuitry defined in claim 16 wherein the gate conductor comprises metal.

19. The nonvolatile memory element circuitry defined in claim 18 wherein the control circuitry comprises an n-channel metal-oxide-semiconductor transistor coupled to the body region and operable to supply a ground voltage to the body region while the control circuitry measures the resistance of the source electrode to determine whether the nonvolatile memory element has been programmed.

20. The nonvolatile memory element circuitry defined in claim 18 wherein the source electrode forms part of a source for the metal-oxide-semiconductor transistor structure, wherein the metal-oxide-semiconductor transistor structure further comprises a doped silicon source region to which the source electrode is coupled, and wherein, when the metal-oxide-semiconductor transistor exhibits breakdown between the source electrode and the drain electrode, sufficient current flows through the source electrode to generate a void between the source electrode and the doped silicon source region.

* * * * *